(12) United States Patent
Marks et al.

(10) Patent No.: US 6,391,148 B2
(45) Date of Patent: May 21, 2002

(54) COBALT SILICIDE ETCH PROCESS AND APPARATUS

(75) Inventors: Steven Marks, Petaluma; Leslie G. Jerde, Novato; Stephen P. DeOrnellas, Santa Rosa, all of CA (US)

(73) Assignee: Tegal Corporation, Petaluma, CA (US)

( * ) Notice: Subject to any disclaimer, the term of this patent is extended or adjusted under 35 U.S.C. 154(b) by 0 days.

(21) Appl. No.: 09/760,402

(22) Filed: Jan. 12, 2001

Related U.S. Application Data

(62) Division of application No. 09/454,814, filed on Dec. 3, 1999.

(51) Int. Cl.[7] .................................................. C23F 1/02
(52) U.S. Cl. ....................... 156/345; 118/719; 438/714; 438/719
(58) Field of Search ................................ 438/714, 719, 438/720, 721, 722; 118/719, 723; 156/345

(56) References Cited

U.S. PATENT DOCUMENTS

| | | | |
|---|---|---|---|
| 5,571,366 A | 11/1996 | Ishii et al. ................... 156/345 |
| 5,572,366 A * | 11/1996 | Ishii et al. ................... 156/345 |
| 5,645,683 A * | 7/1997 | Miyamoto ................ 156/643.1 |
| 5,695,564 A | 12/1997 | Imahashi ..................... 118/719 |
| 5,695,654 A * | 12/1997 | Imahashi ..................... 118/719 |
| 5,700,734 A | 12/1997 | Ooishi ......................... 438/592 |
| 5,756,401 A * | 5/1998 | Iizuka ......................... 438/719 |
| 6,008,139 A | 12/1999 | Pan et al. .................... 438/730 |
| 6,046,116 A * | 4/2000 | DeOrnellas et al. ........ 438/715 |
| 6,087,264 A | 7/2000 | Shin et al. .................. 438/706 |

OTHER PUBLICATIONS

U.S. application No. 09/454,814, Marks et al., filed Dec. 3, 1999.

\* cited by examiner

*Primary Examiner*—Felisa Hiteshew
*Assistant Examiner*—Duy-Vu Deo
(74) *Attorney, Agent, or Firm*—Fliesler, Dubb, Meyer & Lovejoy LLP

(57) ABSTRACT

Method and apparatus for etching a silicide stack including etching the silicide layer at a temperature elevated from that used to etch the rest of the layers in order to accomplish anisotropic etch.

17 Claims, 8 Drawing Sheets

COBALT SILICIDE ETCH PROCESS AND APPARATUS

This application is a divisional of Ser. No. 09/454,814, filed Dec. 3, 1999.

CROSS REFERENCE TO RELATED PATENT DOCUMENTS

The following co-pending U.S. patent documents are assigned to Tegal Corporation, the assignee of the present application, and these documents are incorporated herein by reference:

(A) U.S. Pat. No. 5,958,139 issued Sep. 28, 1999, to Vladimir E. Leibovich et al. and entitled, "PLASMA ETCH SYSTEM";

(B) U.S. patent application Ser. No. 08/450,369 filed May 25, 1995, by Vladimir E. Leibovich et al., and entitled "PLASMA ETCH SYSTEM";

(C) U.S. patent application Ser. No. 08/675,559 filed Jul. 3, 1996, by Stephen P. DeOrnellas et al., and entitled "PLASMA ETCH REACTOR AND METHOD";

(D) U.S. patent application Ser. No. 09/152,238 filed Sep. 11, 1998, by Stephen P. DeOrnellas et al., and entitled "PLASMA ETCH REACTOR HAVING A PLURALITY OF MAGNETS";

(E) U.S. patent application Ser. No. 08/675,093 filed Jul. 3, 1996, by Stephen P. DeOrnellas et al., and entitled "PLASMA ETCH REACTOR AND METHOD FOR EMERGING FILMS";

(F) U.S. patent application Ser. No. 09/384,614 filed Aug. 27, 1999, by Stephen P. DeOrnellas et al., and entitled "PLASMA ETCH REACTOR AND METHOD FOR EMERGING FILMS";

(G) U.S. patent application Ser. No. 09/384,858 filed Aug. 27, 1999, by Stephen P. DeOrnellas et al., and entitled "PLASMA ETCH REACTOR AND METHOD FOR EMERGING FILMS";

(H) U.S. patent application Ser. No. 08/742,861 filed Nov. 1, 1996, by Stephen P. DeOrnellas et al., and entitled "IMPROVED METHOD AND APPARATUS FOR ETCHING A SEMICONDUCTOR WAFER WITH FEATURES HAVING VERTICAL SIDEWALLS"; and (I) U.S. patent application Ser. No. 08/974,089 filed Nov. 19, 1997, by Stephen P. DeOrnellas et al., and entitled, "A METHOD FOR MINIMIZING THE CRITICAL DIMENSION GROWTH OF A FEATURE ON A SEMICONDUCTOR WAFER".

FIELD OF THE INVENTION

The present invention relates to silicide etch processes and apparatus generally and, in particular, to cobalt silicide etch processes and apparatus.

BACKGROUND OF THE INVENTION

Since the sheet resistance of metal silicides is much lower than polysilicon, metal suicides are commonly used as a cladding on polysilicon to reduce power consumption and the RC time constant in microelectronic integrated circuits. Of all known suicides, cobalt silicide has the lowest sheet resistance and is thus the most desirable silicide for microelectronic integrated circuit use. The introduction of silicides, and particularly of cobalt silicide, for microelectronic integrated circuit fabrication has, however, been limited by the severe difficulty of etching these materials. The reason for the etch difficulty of cobalt silicide is that cobalt has no known compounds that can serve as volatile etch reaction products at temperatures below 500° C. (Handbook of Chemistry and Physics).

SUMMARY OF THE INVENTION

Accordingly, the present invention has been developed to solve the problem of the etching of suicides and, in particular, cobalt silicide. The invention includes both a method and apparatus for accomplishing this task.

The method of processing a silicide layer which is included in a layer stack positioned on a substrate includes the steps, in any order, of performing a process which can hold the substrate at a first temperature and changing the temperature of the substrate in order to process the silicide layer at a second temperature.

A method and apparatus of the invention provides for processing a silicide layer which is included in the layer stack with another layer including the steps, in any order, of processing the silicide layer at an elevated temperature and processing another layer at a lower temperature.

More specifically, the process includes etching a layer stack including the silicide and at least one of an oxide and a polysilicon. The process includes performing the etching of the silicide at an elevated temperature and performing the etching of the other layers at lower temperatures. Such a process can occur in a single etch reactor or in two etch reactors, with the silicide etch step occurring in a different reaction than the polysilicon etch step. By such a mechanism, anisotropic etching of both the silicide and the other layers can be accomplished. Additionally such a method utilizes the rapid cooling and/or heating of the wafer in order to bring the wafer temperature to the appropriate range for etching of the relevant layer.

In another preferred aspect of the invention, the silicide layer is etched at a temperature of 150° C. or above while the remaining layers of the layer stack are etched at approximately 80° C. or below.

In an aspect of the invention, the silicide layer can preferably include cobalt suicide. Other silicide layers can include tantalum silicide, titanium silicide, or molybdenum silicide. Further, the other layers can include, by way of example, an oxide layer and/or polysilicon layers.

The novel method is carried out in a novel apparatus which is designed for handling hard to process silicide films as well as for effectively handling the remaining film. Such an apparatus, preferably, has a high selectivity to oxide films. In particular, the unique apparatus includes a reactor having a tri-electrode configuration. In one embodiment, the method is carried out in such a tri-electrode reactor having first and second electrodes and a side peripheral electrode. The second electrode is provided with high and low frequency power supplies. The side peripheral electrode can alternatively be provided with a high frequency power supply. This reactor includes a chuck which can rapidly change and maintain the temperature of the wafer at advantageous levels in order to process silicide layers and, alternatively, to process other layers, including by way of example, oxide layers and polysilicon layers.

Alternatively, the suicide films can be processed in a tri-electrode reactor chamber wherein the chuck electrode is provided with low and high frequency power supplies. The side peripheral electrode can be grounded or floating. Alternatively, the side peripheral electrode can be supplied with a low frequency power supply. With such an arrangement it is again preferable that the chuck is configured in order to be able to rapidly change the temperature of the wafer. Preferably for such an arrangement, other layers such as oxide and polysilicon layers can be processed in a separate reactor which is first described herein above with the high frequency power supply communicating with the side peripheral electrode.

It is to be understood that the above described reactors are generally considered capacitively coupled reactors and that other reactors including inductively coupled reactors can be used and be in accordance with the invention. Thus, still alternatively, the invention can be practical in an inductively coupled di-electrode or tri-electrode reactor. In one embodiment, the top inductive coil electrode would be at a high frequency and the bottom electrode associated with the chuck would be at a low frequency. Both steps of etching a silicide layer and a non-silicide layer could be performed in the same chamber. If such a inductively coupled reaction had multiple etch chambers, if desired, a silicide etch step could be performed in one chamber and a non-silicide etch step could be performed in another chamber.

Accordingly, an object of the invention includes using a unique combination of one or more of a preferred reactor configuration, wafer temperature and processing conditions to successfully meet the microelectronic integrated circuit fabrication requirements for silicides generally and cobalt silicide in particular.

The volatility problem with potential etch reaction products for cobalt makes the etchability of cobalt silicide similar in difficulty to platinum or iridium since these elements also have no volatile reaction products at conventional etch process wafer temperatures. This invention teaches the use of the above reactor configurations, or other comparable reactors, the use of elevated wafer temperatures, the use of suitable hard mask materials, the process settings for gas chemistry, pressure, and RF power, and high speed changes in wafer temperature to etch each of the materials of a cobalt polycide stack. In particular the invention addresses the following in a variety of combinations:

1. The wafer temperature range, gas chemistry, pressure, and RF power, required to achieve high etch rate, and anisotropic etching of cobalt silicide with minimal etch rate and profile microloading.

2. The wafer temperature range to simultaneously meet all the etch requirements of both the cobalt silicide and polysilicon layers in the cobalt polycide stack.

3. The use of rapid wafer temperature changes, through a suitably designed wafer chuck to etch each layer in the cobalt polycide stack to meet all etch requirements.

4. The use of suitable hard mask materials to facilitate elevated wafer temperature etching and meet the mask requirements for etching cobalt polycide stack structures.

DETAILED DESCRIPTION OF THE PREFERRED EMBODIMENT

Figure 1:
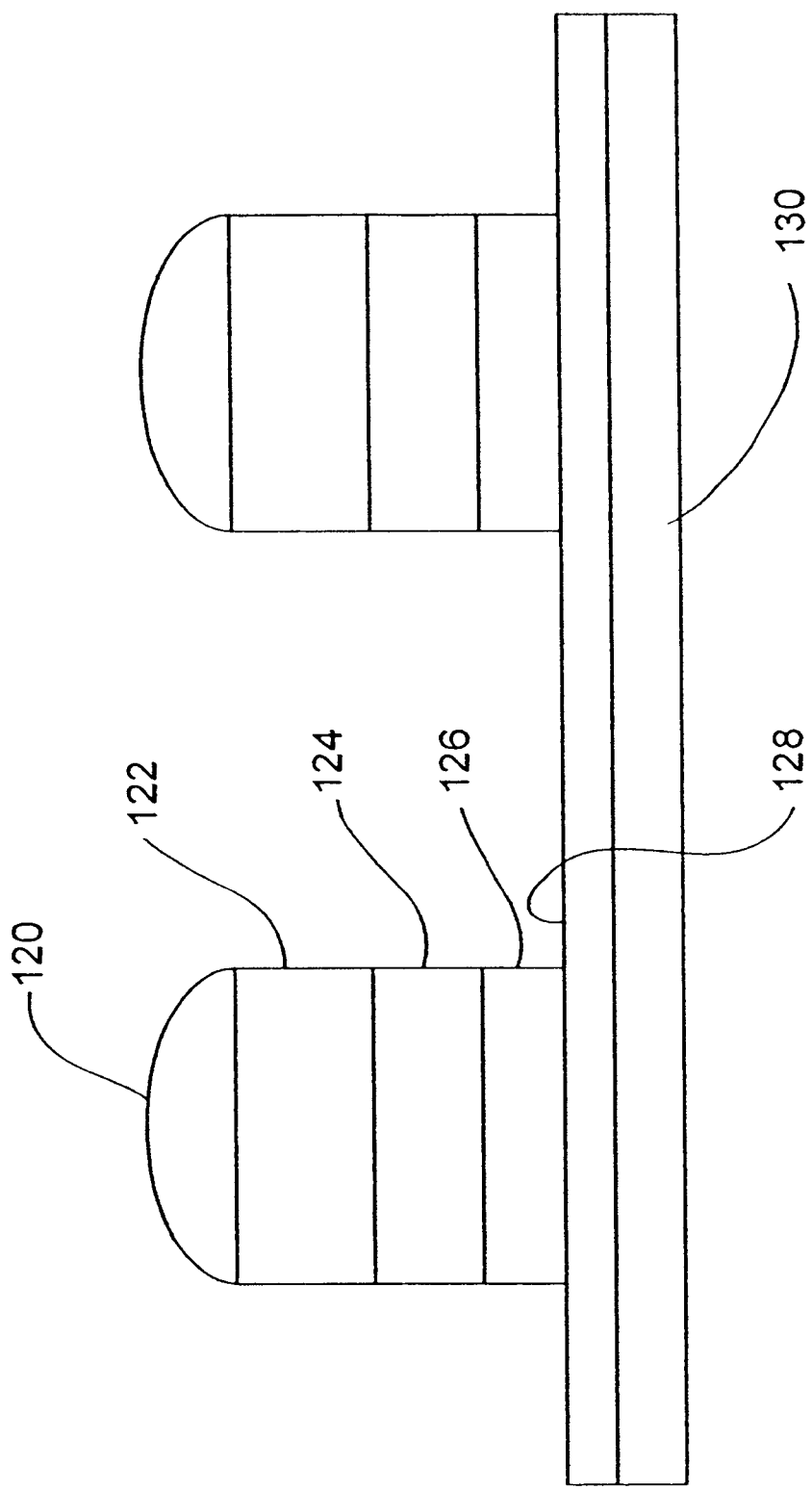
FIG. 1 depicts a side elevational view of the polysilicon stack partially etched in accordance with the invention.

The present method is beneficial for etching a layer stack, including silicides and in particular a cobalt silicide. A cobalt polysilicide stack is depicted in FIG. 1. The embodiment depicted in FIG. 1 has been partially anisotropically etched using the method of the invention. In FIG. 1, layers depicted include a photoresist mask layer 120, oxide hard mask layer 122 such as a layer comprised of $SiO_2$, a cobalt silicide layer ($CoSi_2$) 124, a doped polysilicon layer 126, a gate oxide layer (particularly $SiO_2$) 128, and the silicon substrate 130. Other stacks of different materials with different silicides are within the spirit and scope of the invention. The relative thicknesses of the various layers in a typical polyside stack in Å units is given by the below Table 1.

TABLE 1

| Photoresist Mask | 2000–5000 Å |
| --- | --- |
| Oxide hard Mask | 1500–2000 Å |
| $CoSi_2$ | 700–750 Å |
| Polysilicon | 700–750 Å |
| Gate Oxide | 50–60 Å |
| Silicon Substrate | Various |

As the gate oxide layer is relatively thin, there is a requirement that the inventive process and reactor have a high selectivity to such oxide layer. There also needs to be a high selectivity to the hard mask so that there is little or no pattern degradation in the transfer of the pattern due to the erosion of the mask. It is beneficial that this be accomplished and that the stack be etched anisotropically. Such results can occur with the stack when, by way of example, the silicide layer is etched with the wafer temperature above about 150° C. and preferably in the range of 170° C.–250° C. However, the polysilicon layer and the oxide layers are preferably etched at a temperature of around 80° C. or below in order that they are anisotropically etched. With the capacitively coupled reactors described herein, the polysilicon etch can be in the range of about 80° C. to about 5° C. and be anisotropic. With the inductively coupled reactors described herein, the polysilicon etch can be in the range of about 80° C. to about negative 20° C. and be anisotropic. Above around 80° C. the polysilicon layer will be etched isotropically, which for many applications would be undesirable. Accordingly, the present invention is able to accurately and rapidly control the temperature of the substrate so that in one reactor chamber, as shown for example in FIG. 2, layers of a single wafer can be etched at a first temperature and the wafer temperature can be changed rapidly so that etching can occur at a second temperature, with both etch processes being anisotropic.

With respect to the reactor of FIG. 2, anisotropic etching for the cobalt silicide layer can be successfully carried out using the parameters specified below in Table 2. In this table, the etch gas is chlorine and the temperature of the wafer during etching for the cobalt silicide layer is specified. The pressure specified is that of the main reactor chamber and the power applied to the high frequency and low frequency power supplies is specified. The high frequency power supply is operated at 13.56 MHz while the low frequency power supply is operated at about 450 KHz. In this process, the cobalt silicide is etched isotropically with etch times on the order of 20 sec. to 30 sec.

TABLE 2

| Process | Flow Cl$_2$ SCCM | Wafer Temp ° C. | Pressure (mT) | HF: (MHz) Watts | LF: (KHz) Watts |
|---|---|---|---|---|---|
| 1 | 90 | 220 | 6.5 | 800 | 200 |
| 2 | 50 | 220 | 3.5 | 800 | 270 |
| 3 | 70 | 220 | 5 | 800 | 140 |
| 4 | 70 | 200 | 10 | 800 | 140 |

A more preferred process than that specified in Table 2 would be with the temperature of the wafer held at approximately 20° C.–30° C. lower than the temperature specified in Table 2 for purposes of etching the cobalt silicide layer. For this process, the chuck used was that depicted in FIG. 4, which chuck will be described more fully herein below. This chuck is able to control the temperature of the wafer by controlling the pressure of helium held on the back side of the wafer. Preferably, the helium is held at a pressure of about less than 1 torr in order to achieve the higher temperatures in the wafer, with the range being 150° C. and above. With helium pressurized at about 5–10 torr on the back side of the wafer, the wafer settles to a lower temperature of about 80° C. or below for etching of the oxide and polysilicon layers. It is to be understood that alternatively the flow rate of chlorine can be in the range of about 5 SCCM to about 200 SCCM.

On high density devices a phenomenon called microloading introduces etch rate variations. Microloading is a change in the local etch rate relative to the area of the material being etched. In one example of microloading, a large sparse area (leaving few features after etching), will load the etching process with removed material, slowing the etching rate down in that area, while a smaller less sparse etch area proceeds at a faster rate. However, in other situations, microloading can occur in dense areas. This arrangement is highly desirable for anisotropic etch with profiles of greater than 86° C. and also for eliminating the above indicated microloading.

Figure 6:
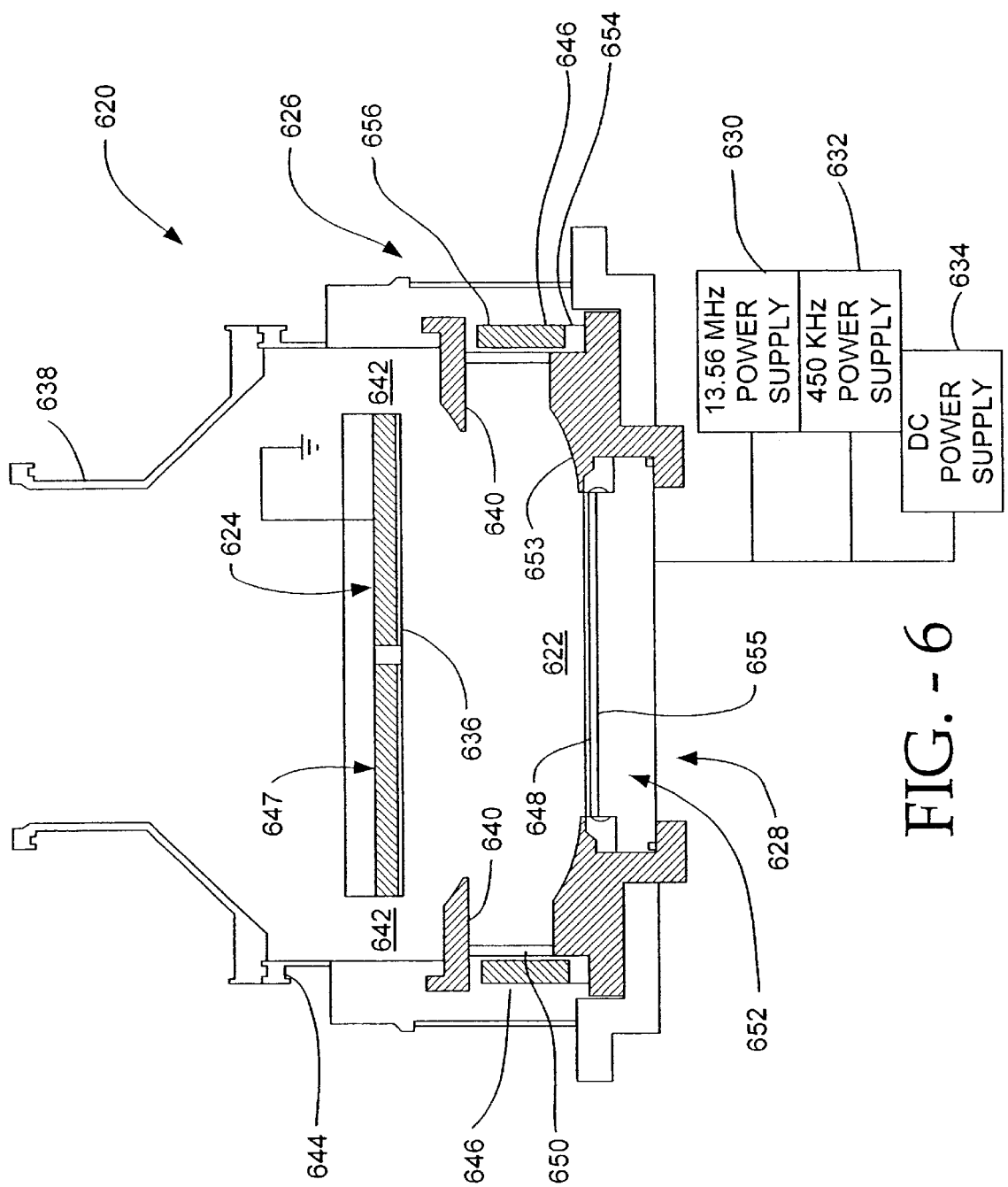
FIG. 6 depicts another embodiment of a reactor for carrying out the method of the invention.

For etching a cobalt silicide layer using the reactor of FIG. 6, the following parameters of Table 3 are used.

TABLE 3

| Main Chamber Pressure | 3.5–6.5 mT |
|---|---|
| HF (MHz) | 500–800 Watts |
| LF (KHz) | 50–270 Watts |
| Cl$_2$ Total Flow | 5–200 SCCM |
| Wafer Backside Pressure | 0T–10T |
| Sidewall Temperature | 80° C. |
| Top Electrode Temperature | 80° C. |
| Etch Time | 20–30 sec |

This table indicates that the pressure in the chamber is approximately 5 millitorr and that the pressure of the helium on the back side of the wafer is about 5 torr in order to ensure that the wafer is maintained at an elevated temperature in order to have anisotropic etching of the Cobalt silicide. Etch results from this process are shown below in Table 4.

TABLE 4

| Wafer Temperature | Etch Rate | Profile of CoSi$_2$ |
|---|---|---|
| 90 C. | 2800 Å/min | 80 degrees |
| 130 C. | 3600 Å/min | 83 degrees |
| 170 C. | 4800 Å/min | 84 degrees |
| 210 C. | 5600 Å/min | 85 degrees |

With respect to Table 4, it is evident that the etch rate and the profile was a function of temperature. The temperature is adjusted by adjusting the backside pressure. Typically the best results are achieved between 170° C. and 220° C. At about 250° C. the side wall are almost vertical at about 89°.

It is also to be understood that while the above chart shows that the flow rate of chlorine is approximately 50–90 SCCM, that additionally mixtures of chlorine and argon could be used. In such a process the chlorine gas flow rate would be on the order of about 50 SCCM (but with a range of about 5 SCCM to about 200 SCCM) and the argon gas flow rate would be on the order of about 20 SCCM.

Figure 2:
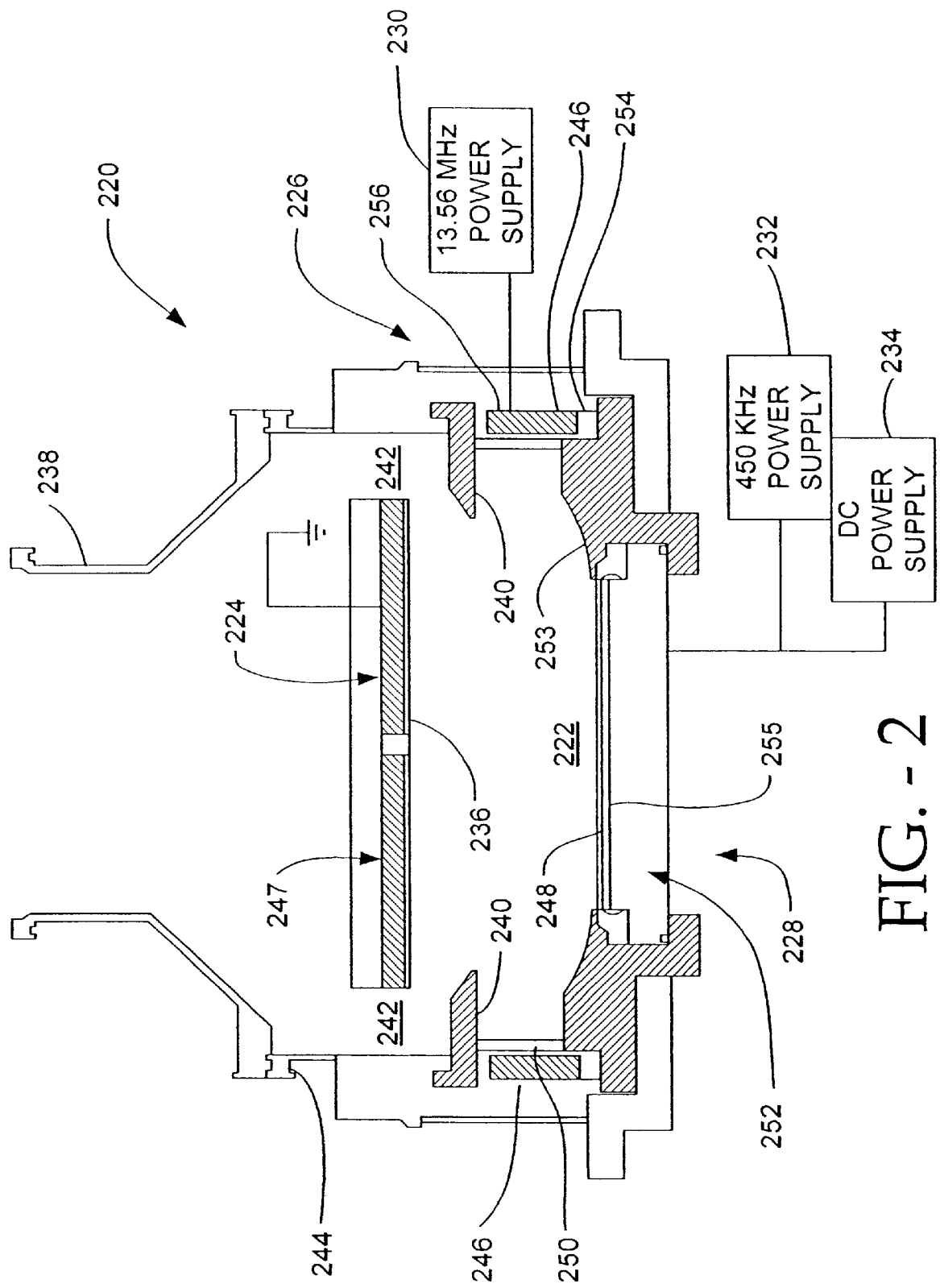
FIG. 2 depicts the first embodiment of a reactor for carrying out the method of the invention.

TRI-ELECTRODE REACTORS OF FIGS. 2 AND 3:

Referring to the figures and in particular to FIG. 2, a side cross-sectional view of an embodiment of the plasma etch reactor 220 of the invention is depicted. This reactor 220 enhances and improves upon the reactor depicted and described in U.S. Pat. No. 4,464,223, which patent is incorporated herein by reference.

Reactor 220 includes a reactor chamber 222 which is bounded by a grounded upper electrode 224, a side peripheral electrode 226, and a bottom electrode 228. In a preferred embodiment, the side peripheral electrode 226 is connected to a power supply 230 which provides power to the side peripheral electrode 226 preferably at 13.56 MHz at a power level of preferably up to about 1100 watts. It is to be understood that this is a high frequency power supply (preferably in the radio frequency range) and that the frequency preferably can range from about 2 MHz to about 950 MHz. The power can also preferably be supplied in the range of 200 watts to 3,000 watts with a voltage of between 100 volts to 5,000 volts.

A second power supply 232 is connected to the bottom electrode 228. The second power supply 232 is preferably operated at 450 KHz with the power being preferably supplied at 30 watts, and at a voltage of 200 volts. This is the low frequency power supply. It is to be understood that this power supply (preferably in the radio frequency range) can be operated in the range of about 10 KHz to about 1 MHz with a power range of 2 watts to 1,000 watts, and a voltage range of 5 volts to 3,000 volts. It is to be understood that with current technology, the lower limit of the high frequency power supply can overlap with the upper limit of the high frequency power supply as long as the high frequency and the low frequency values actually chosen are spaced apart by 1 or 2 MHz. As filtering networks improve such spacing may be eliminated. Also connected to the bottom electrode 228 is a DC power supply 234. The high-frequency power applied to the side electrode 226 controls ion flux, while low-frequency power applied to the bottom electrode 228 independently controls ion energy.

It is the control of the power supplies and principally the high frequency power supply which advantageously controls the density of etch plasma in order to provide superior etch characteristics. Further, it is the design of reactor 220 which provides the enhanced plasma density range from which the optimal plasma density can be selected by the control of the power supply.

Associated with the grounded upper electrode 224 is a central nozzle 236 which directs a jet of process gas into the reactor chamber 222 directed at the semiconductor wafer 248. The jets of process gas from the nozzle 236 are able to effectively reach the surface of the semiconductor wafer 248 and provide a fresh, uniform distribution of process gas over the entire surface of the semiconductor wafer 248. Such nozzle design is one of many embodiments that could work with the present invention.

Immediately above the grounded upper electrode 224 and the nozzle 236 is an exhaust stack 238, which is used to exhaust spent gas species from the reactor chamber 222. It is to be understood that a pump (not shown) is secured to the exhaust stack 238 in order to evacuate the gas species from the reactor chamber 222.

As can be seen in FIG. 2, immediately below the upper electrode 224 and nozzle 236 is a protruding, peripheral baffle 240. Baffle 240 is comprised of insulating material, and protrudes into the exhaust path 242 between the nozzle 236 and the housing 244 of the plasma etch reactor 220. Protruding baffle 240 ensures that there is a good mixture of the various gas species from the nozzle 236 and the solid source 250 in the reactor chamber 222.

Immediately below the protruding baffle 240 and in this embodiment incorporated into the side peripheral electrode 226 is a magnet or plurality of magnets 246. Also preferably incorporated in upper electrode 224 is a magnet or plurality of magnets 247. Either one or both of these magnets 246 and 247 define a magnetic confinement chamber about and coincident with the reactor chamber 222. This magnetic confinement chamber ensure that the charged ion species in the reactor chamber do not leak therefrom, and that the charge ion species are concentrated about the semiconductor wafer 248. This magnetic confinement chamber inhibits the charged ion species from contacting on the walls of the reactor chamber 222.

Covering the side peripheral electrode 226 and the magnets 246 is the above referenced side peripheral solid source 250. This solid source 250 provides for an innovative source of a gaseous species which can be sputtered through the bombardment of, for example, radio frequency excited ions which knock or erode atoms of the gas species from the solid source 250 into the reaction chamber 222. The erosion of gaseous species from the surface of the solid source can be affected by pulsing one or both of the above AC power supplies. As a further advantage, as portions of the surfaces of the solid source erode, no particles can be formed on the eroding surface by the combination of gaseous species. Thus, contamination from such particles formed on eroding portions of the solid surface are eliminated.

Figure 3:
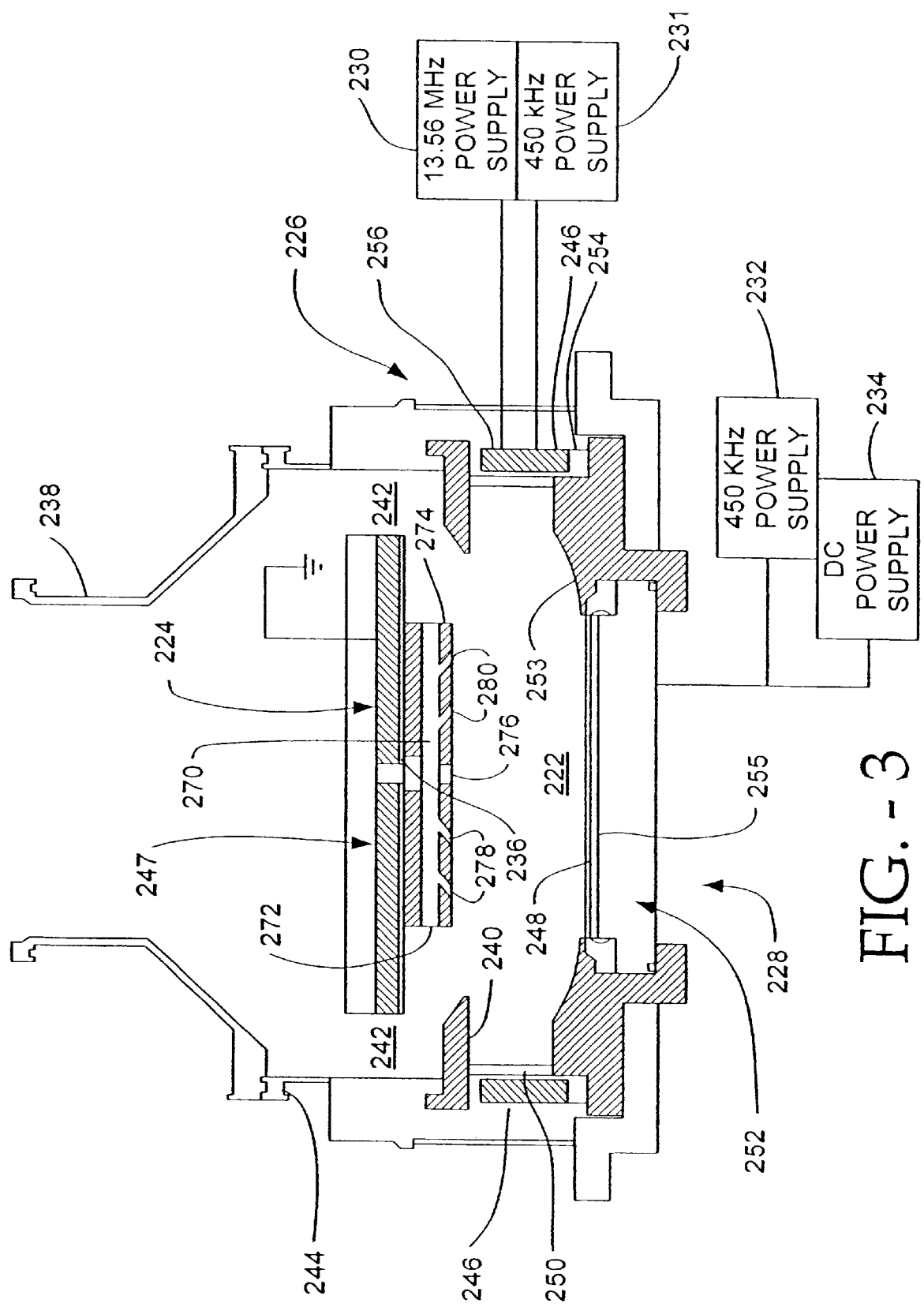
FIG. 3 depicts a second embodiment of a reactor for carrying out the method of the invention.

Immediately below the solid source 250 is the electrostatic wafer chuck 252 which positions the semiconductor wafer 248 relative to the reactor chamber 222. Wafer centering ring 253 centers the wafer 248 on the wafer chuck 252. In this embodiment, the wafer chuck 252 as well as the bottom electrode 228 can be moved vertically downward in order to insert and remove the wafer 248. As can be seen in FIGS. 2 and 3, a backside gas delivery space 255 is depicted. As described more fully with a description of the chuck, a gas such as helium can be selectively delivered to space 255 in order to selectively control the temperature of wafer 248.

In this embodiment, if desired, the side peripheral electrode 226 and the magnets 246 can be cooled using a cooling water manifold 254. It is further to be understood that the solid source 250 can be heated if desired using a hot water manifold 256. Other methods of heating the solid source 250, and particularly the front exposed surface thereof, include resistive and inductive heating, and radiant heat provided by lamps and other sources of photons.

The protruding baffle 240 as well as the configuration of the magnets and the process gas jets from the nozzle, and the gas species eroded from the solid source, provide for a high density plasma adjacent to the surface of the semiconductor wafer. This configuration greatly increases the range of densities that can be achieved within the reactor chamber 222. The exact density required can be selected from the greater range of densities by controlling the power provided to the peripheral electrode 226 by the power source 230. The power source can be turned clown if there is a desire to reduce the erosion rate of gas species from the solid source, and to reduce the density of the plasma. Alternatively, the power source may be turned up in order to increase the density of the plasma in the reactor chamber 222.

By way of example only, if a polysilicon layer is being etched, the power provided by high frequency power source 230 would be turned down as a less dense plasma and a higher erosion or generation rate is required from the solid source 250. Alternatively, if a silicide is being etched, the power would be turned up as a denser plasma and a lower erosion or generation rate would be desired from the solid source. Further, the lower frequency power source can also be adjusted to affect the results of the etching process in the above invention.

The above range of operation is not possible with prior devices. It is to be understood that one or more of the above features can be used to enlarge the plasma density range and thus improve the etch process and fall within the spirit and scope of the invention.

An alternative embodiment of the reactor 220 is shown in FIG. 3. Similar components are numbered with similar numbers as discussed hereinabove. In FIG. 3, the nozzle 236 has been modified in order to improve the uniformity of the mixture of the gaseous species in reactor chamber 222. As can be seen in FIG. 3, the nozzle 236 includes a manifold 270 which can channel the process gases in a number of directions. From manifold 270 there are horizontal ports 272, 274 which direct jets of the process gases horizontally and parallel to the upper electrode 224. Port 276 directs jets of the gas vertically downward directly onto the wafer 248. Ports 278 and 280 channel jets of the process gases in a direction skewed to the horizontal, and principally toward the periphery of the wafer 248 in order to assure a uniform distribution of process gases and/or a good mixture of the gas species sputtered or otherwise eroded from the solid source 250 and the jets of process gases. In this embodiment, it is also the combination of the ports of the manifold 270 and the protruding baffle 240 which ensures that a good mixture of (1) the gas species sputtered or eroded from the solid source 250, and (2) the process gases from the ports of the nozzle 236, are presented to the surface of the semiconductor wafer 248.

In this alternative embodiment, if desired, a second low frequency power supply 231 can be communicated with the peripheral electrode 226. This power supply would preferably have a frequency of 450 KHz. This power supply would be in all aspects similar to power supply 232. The high frequency power supply 230 would control the plasma density while the low frequency power supply 231 would control the erosion rate of gaseous species from the solid source. This would be an alternative to having the high frequency power supply control both the density of the plasma and the rate of erosion in the solid source.

Etching in prior art devices is usually performed in the 300 to 500 millitorr range, which range is one to two orders of magnitude higher than the low pressures contemplated by the reactor of the present invention. For etching of submicron features required by state-of-the-art semiconductor devices, low pressure operations are desirable. However, at low pressures, it is more difficult to maintain a high density plasma.

For the embodiments of FIGS. 2 and 3, the present embodiment contemplates a magnetic field which contains the plasma at a low pressure (3–5 millitorrs), with a high plasma density ($10^{11}$ cm$^3$ at the wafer), and with low ion energy (less than 15 to 30 electron volts). Magnetic containment is not required for an inductively coupled reactor or for that matter for a capacitively coupled reactor. For such inductively coupled reactions, magnetic coupling generally enhances plasma uniformity, but is not needed to enhance plasma density. Generally, low pressure operation would be at about 150 millitorr or about 100 millitorr or less and preferably about 20 millitorr or about 10 millitorr or less. For submicron (sub 0.5 microns) devices, the plasma source must operate at a low pressure with a high density of activated gases at the wafer and a low ion energy in order to deliver superior etching results. A low pressure plasma improves the overall quality of the etch by minimizing the undercutting of the wafer features as well as the effect of microloading, both of which can adversely affect overall yield. Low pressure, however, requires a high density plasma at the wafer to increase the number of plasma particles reacting with a film on the semiconductor wafer being etched in order to maintain a fast etch rate. A fast etch rate is one factor leading to a higher average throughput. Further, low ion energy leads to improved etch selectivity and minimizes wafer damage. Both of which improve overall yield.

The reactor 220 of the present invention can be used to etch a variety of different substrates or films which require different etch chemistry or recipe. Generally, this chemistry includes two or more of the following gases: halogen gases, halogen containing gases, noble gases, and diatomic gases.

TRI-ELECTRODE REACTORS OF FIGS. 6 AND 7:

Referring to the figures and in particular to FIG. 6, a side cross-sectional view of an embodiment of the plasma etch reactor 620 of the invention is depicted. This reactor 620 enhances and improves upon the reactor depicted and described in U.S. Pat. No. 4,464,223, entitled PLASMA REACTOR APPARATUS AND METHOD, and U.S. Pat. No. 4,579,618, entitled PLASMA REACTOR APPARATUS which patents are incorporated herein by reference.

Reactor 620 includes a reactor chamber 622 which is bounded by a grounded upper electrode 624, a side peripheral electrode 626, and a bottom electrode 628. The side peripheral electrode 626 is grounded or has a floating potential and in operation can be charged up by the plasma. In a preferred embodiment, the bottom electrode 628 is connected to a power supply 630 which provides power to the bottom electrode 626 preferably at 13.56 MHz (or multiples thereof) at a power level of preferably 900 watts and at a voltage of preferably 1,200 volts. The high frequency power supply can operate from 10 watts up to 2000 watts in a preferred embodiment. It is to be understood that this is a high frequency power supply (preferably in the radio frequency range) and that the frequency preferably can range from 2 MHz to 40 MHz and upwards to about 900 MHz. The power can also preferably be supplied in the range of 100 watts to 3,000 watts with a voltage of between 200 volts to 5,000 volts.

A second power supply 632 is additionally connected to the bottom electrode 628. The second power supply 632 is preferably operated at 450 KHz with the power being preferably supplied at 100 watts, and at a voltage of 300 volts. This is the low frequency power supply. It is to be understood that this power supply (preferably in the radio frequency range) can be operated in the range of about 100 KHz to about 950 KHz (preferably 1 MHz or less) with a power range of 10 watts to 2,000 watts, and a voltage range of 10 volts to 5,000 volts. Also connected to the bottom electrode 628 is a DC power supply 634. The high-frequency power supply controls ion flux, while low-frequency power supply independently controls ion energy.

It is the control of the power supplies and principally the high frequency power supply which advantageously controls the density of etch plasma in order to provide superior etch characteristics. Further, it is the design of reactor 620 which provides the enhanced plasma density range from which the optimal plasma density can be selected by the control of the power supply.

Associated with the grounded upward electrode 624 is a central nozzle 636 which directs a jet of process gas into the reactor chamber 622 directed cit the semiconductor wafer 648. The jets of process gas from the nozzle 636 are able to effectively reach the surface of the semiconductor wafer 648 and provide a fresh, uniform distribution of process gas over the entire surface of the semiconductor wafer 648.

Immediately above the grounded upper electrode 624 and the nozzle 636 is an exhaust stack 638, which is used to exhaust spent gas species from the reactor chamber 622. It is to be understood that a pump (not shown) is secured to the exhaust stack 638 in order to evacuate the gas species from the reactor chamber 622.

As can be seen in FIG. 6, immediately below the upper electrode 624 and nozzle 636 is a protruding, peripheral baffle 640. Baffle 640 is comprised of insulating material, and as will be discussed below, protrudes into the exhaust path 642 between the nozzle 636 and the housing 644 of the plasma etch reactor 620. Protruding baffle 640 ensures that there is a good mixture of the various gas species from the nozzle 636 and the solid source 650 in the reactor chamber 622.

Immediately below the protruding baffle 640 and in this embodiment incorporated into the side peripheral electrode 626 is a magnet or plurality of magnets 646. Also preferably incorporated in upper electrode 624 is a magnet or plurality of magnets 647. As will be discussed below, either one or both of these magnets 646 and 647 define a magnetic confinement chamber about and coincident with the reactor chamber 622. This magnetic confinement chamber ensure that the charged ion species in the reactor chamber do not leak therefrom, and that the charge ion species are concentrated about the semiconductor wafer 648. This magnetic confinement chamber inhibits the charged ion species from contacting on the walls of the reactor chamber 622. Again, as discussed before, such magnets can enhance, but are not required for, the operation of an inductively coupled reactor or for that matter, a capacitively coupled reactor.

Covering the side peripheral electrode 626 and the magnets 646 is a side peripheral solid source 650. Such a solid source is not required in the preferred embodiment as there is no power provided to the ring electrode 626. If, however, in addition to the above power source, a high frequency power source were provided to the solid source 650, then this solid source 650 would provide for an innovative source of a gaseous species which can be sputtered through the bombardment of, for example, radio frequency excited ions which knock or erode atoms of the gas species from the solid source 650 into the reaction chamber 622. The erosion of gaseous species from the surface of the solid source can be affected by the pulsing of power supplies. As a further advantage, as portions of the surfaces of the solid source erode, no particles can be formed on the eroding surfaces by the combination of gaseous species. Thus, contamination from such particles formed on eroding portions of the solid surfaces are eliminated.

Figure 7:
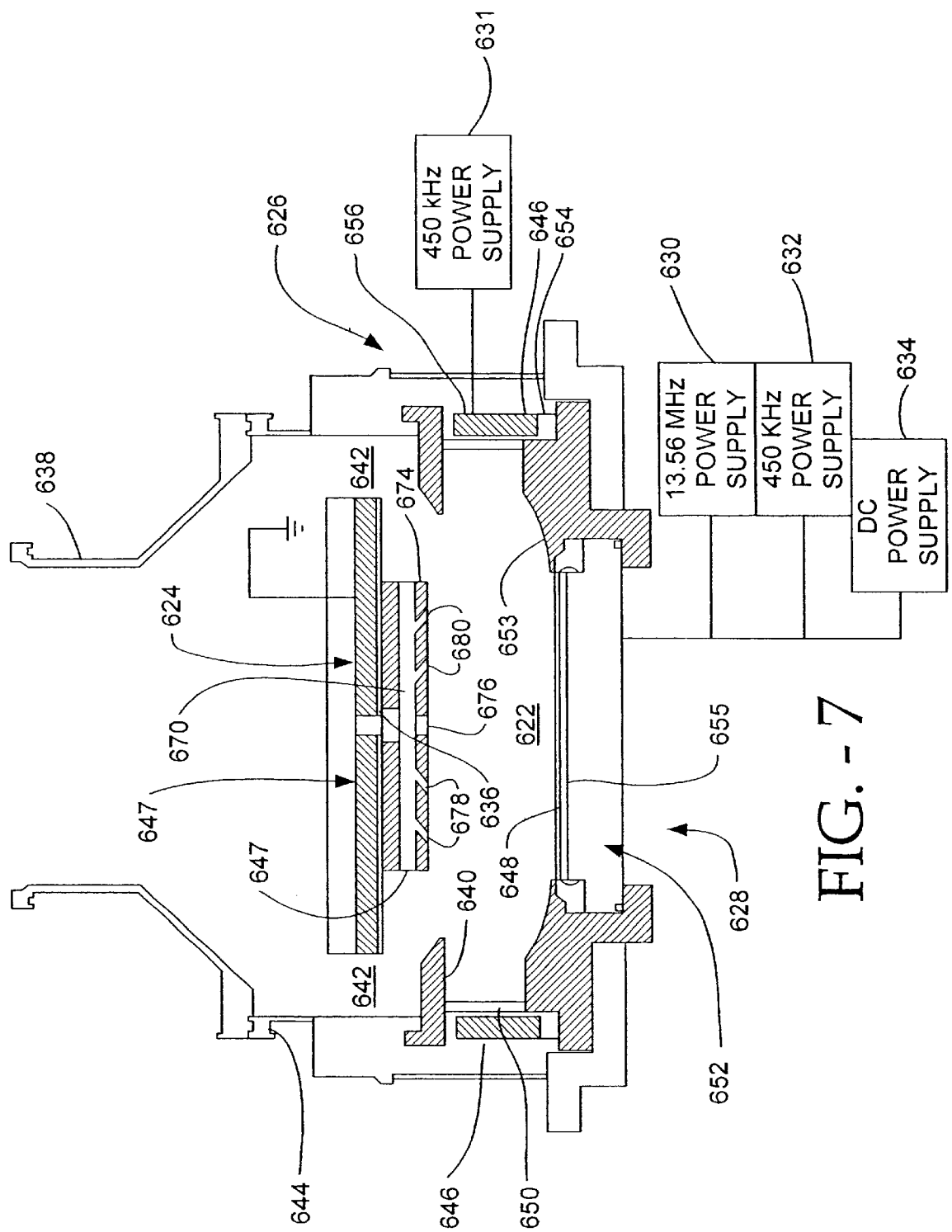
FIG. 7 depicts yet a further embodiment of a reactor for carrying out the method of the invention.

Immediately below the solid source 650 is the electrostatic wafer chuck 652 which positions the semiconductor wafer 648 relative to the reactor chamber 622. Wafer centering ring 653 centers the wafer 648 on the wafer chuck 652. In this embodiment, the wafer chuck 652 as well as the bottom electrode 628 can be moved vertically downward in order to insert and remove the wafer 648. As can be seen in FIGS. 6 and 7, a backside gas delivery space 655 is depicted. As described more fully with a description of the chuck a gas such as helium can be selectively delivered to space 655 in order to selectively control the temperature of wafer 648.

In this embodiment, if desired, the side peripheral electrode 626 and the magnets 646 can be cooled using a cooling water manifold 654. It is further to be understood that the solid source 650 can be heated if desired using a hot water manifold 656. Other methods of heating the solid source 650, and particularly the front exposed surface thereof, include resistive and inductive heating, and radiant heat provided by lamps and other sources of photons.

The protruding baffle 640 as well as the configuration of the magnets and the process gas jets from the nozzle, and the gas species eroded from the solid source (if a power supply is connected to the peripheral ring electrode 626), provide for a high density plasma adjacent to the surface of the semiconductor wafer. This configuration greatly increases the range of densities that can be achieved within the reactor chamber 622.

The above range of operation is not possible with prior devices. It is to be understood that one or more of the above features can be used to enlarge the plasma density range and thus improve the etch process and fall within the spirit and scope of the invention.

An alternative embodiment of the reactor 620 is shown in FIG. 7. Similar components are numbered with similar numbers as discussed hereinabove. In FIG. 7, the nozzle 636 has been modified in order to improve the uniformity of the mixture of the gaseous species in reactor chamber 622. As can be seen in FIG. 7, the nozzle 636 includes a manifold 670 which can channel the process gases in a number of directions. From manifold 670 there are horizontal ports 672, 674 which direct jets of the process gases horizontally and parallel to the upper electrode 624. Port 676 directs jets of the gas vertically downward directly onto the wafer 648. Ports 678 and 680 channel jets of the process gases in a direction skewed to the horizontal, and principally toward the periphery of the wafer 648 in order to assure a uniform distribution of process gases and/or a good mixture of the gas species. In this embodiment, it is also the combination of the ports of the manifold 670 and the protruding baffle 640 which ensures that a good mixture of (1) the gas species sputtered or eroded from the solid source 650 (if a source of power is connected to peripheral ring electrode 626), and (2) the process gases from the ports of the nozzle 636, are presented to the surface of the semiconductor wafer 648.

Etching in prior art devices is usually performed in the 300 to 500 millitorr range, which range is one to two orders of magnitude higher than the low pressures contemplated by the reactor of the present invention. For etching of submicron features required by state-of-the-art semiconductor devices, low pressure operations are desirable. However, at low pressures, it is more difficult to maintain a high density plasma.

For the embodiments of FIGS. 6 and 7, the present invention contemplates a magnetic field which contains the plasma at a low pressure (3–5 millitorrs), with a high plasma density ($10^{11}$ cm$^3$ at the wafer), and with low ion energy (less than 15 to 300 electron volts). Generally, low pressure operation would be at about 150 millitorr or about 100 millitorr or less and preferably about 20 millitorr or about 10 millitorr or less. For submicron (sub 0.5 microns) devices, the plasma source must operate at a low pressure with a high density of activated gases at the wafer and a low ion energy in order to deliver superior etching results. A low pressure plasma improves the overall quality of the etch by minimizing the undercutting of the wafer features as well as the effect of microloading (etching concentrated features more rapidly than less concentrated features), both of which can adversely affect overall yield. Low pressure, however, requires a high density plasma at the wafer to increase the number of plasma particles reacting with a film on the semiconductor wafer being etched in order to maintain a fast etch rate. A fast etch rate is one factor leading to a higher average throughput. Further, low ion energy leads to improved etch selectivity and minimizes wafer damage. Both of which improve overall yield. It is contemplated that the present embodiment can operate at about 150 millitorr or less.

The reactor 620 of the present invention can be used to etch a variety of different substrates or films which require different etch chemistry or recipe. Principally, the embodiments of the invention are used to etch the new emerging films. Generally, this chemistry includes two or more of the following gases: halogen gases, halogen containing gases, noble gases, and diatomic gases.

It is to be understood that while the majority of the embodiments for carrying out the process utilized capacitively coupled electrodes, that inductively coupled electrodes, can be utilized and be within the spirit and scope of the invention. Such an inductively coupled reactor can be reviewed in U.S. Pat. No. 5,277,751, issued on Jan. 11, 1994, entitled METHOD AND APPARATUS FOR PRODUCING LOW PRESSURE PLANAR PLASMA USING A COIL WITH ITS AXIS PARALLEL TO THE SURFACE OF A COUPLING WINDOW, which patent is incorporated herein by reference.

Figure 4:
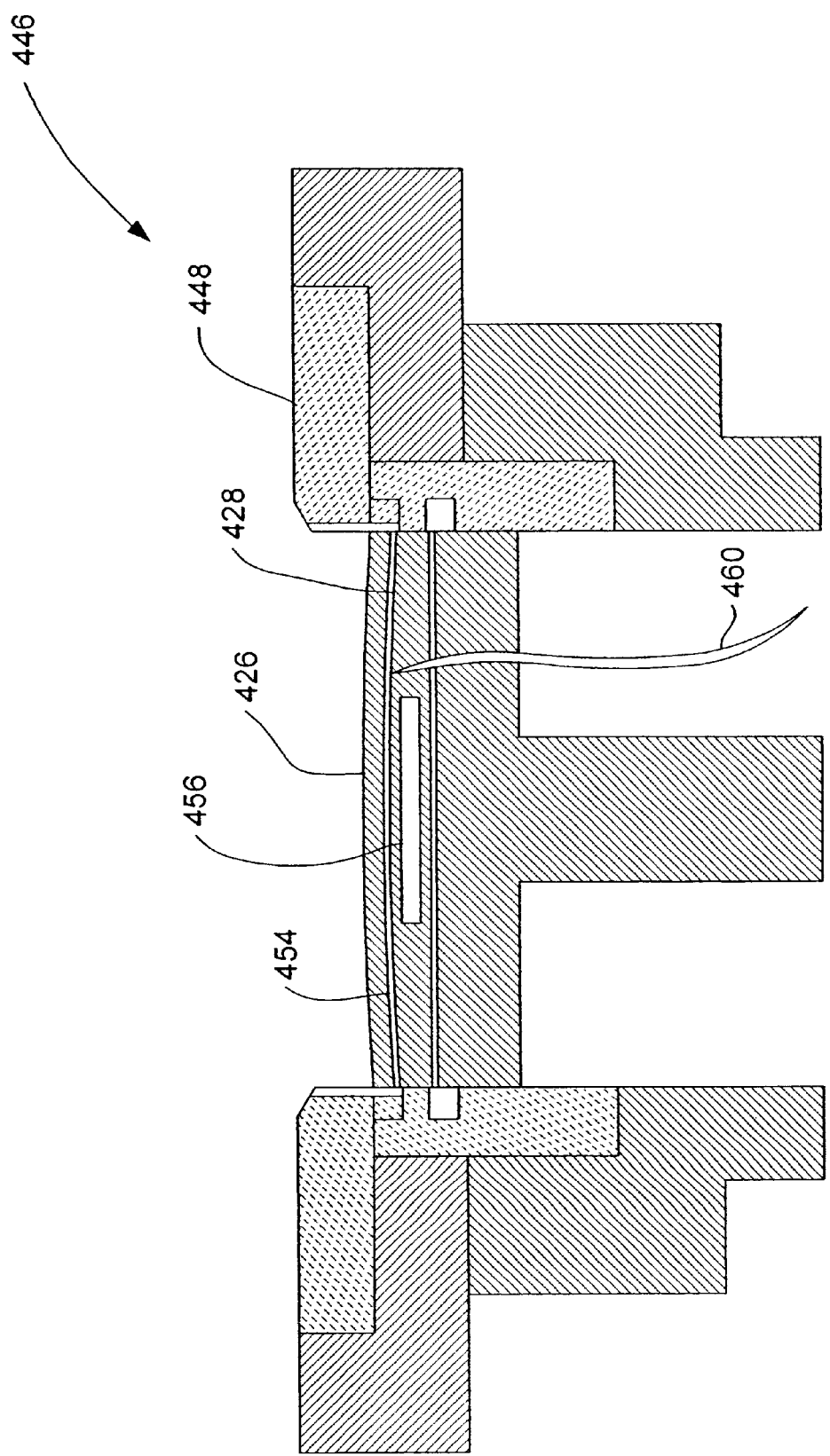
FIG. 4 depicts a first embodiment of a chuck mechanism for carrying out the method of the invention.
Figure 5:
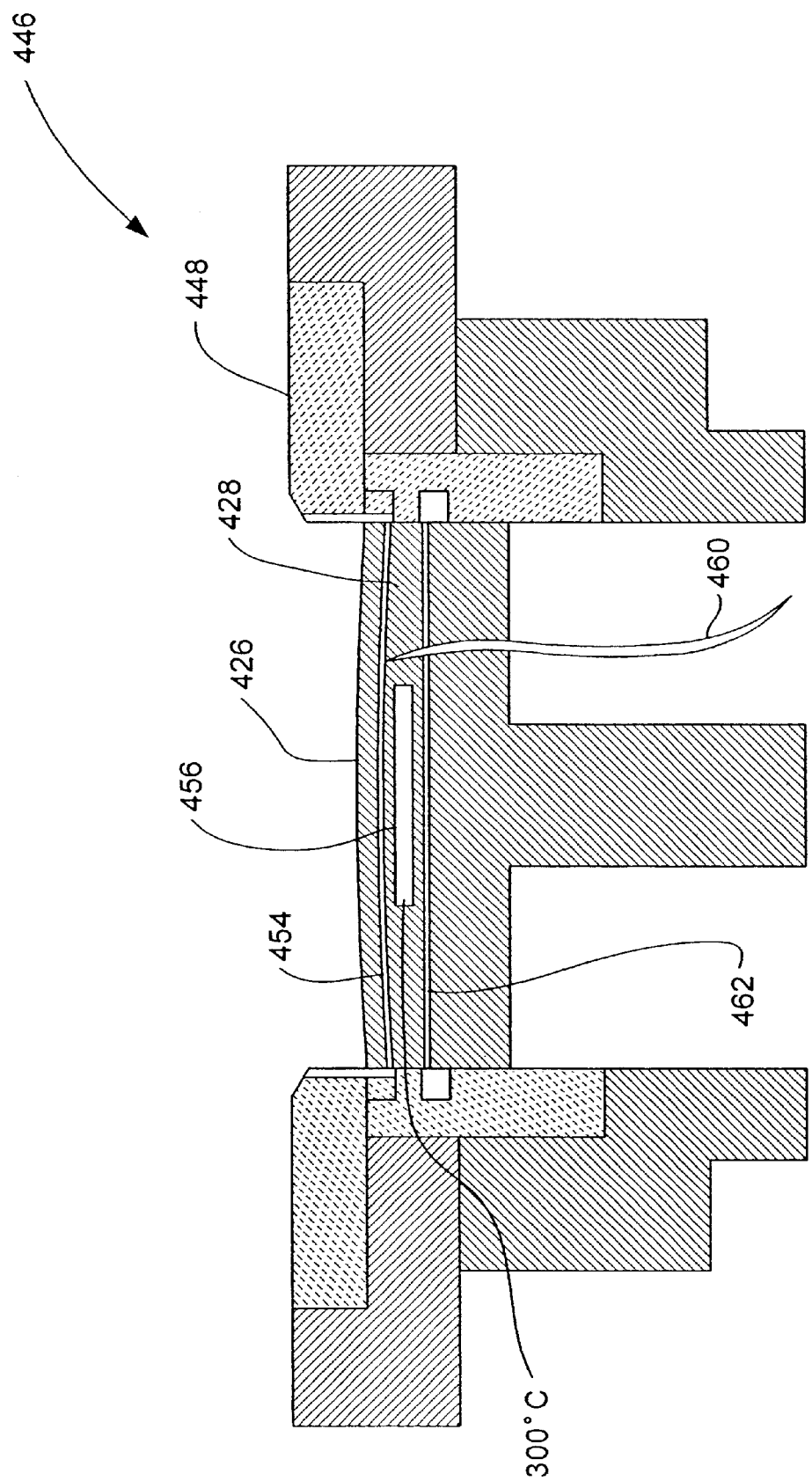
FIG. 5 depicts a second embodiment of a chuck mechanism for carrying out the method of the invention.

REACTOR CHUCK CONFIGURATION:

The method of the present invention can be performed in an etch reactor such as the etch reactor depicted in FIGS. 2, 3, 6, and 7, using the chuck configuration such as the chuck configuration shown in FIG. 4 or 5. It is to be understood that other reactors, including but not limited to other etch reactors and other chuck configurations can be used and be within the scope and spirit of the invention. Presently, chuck 446 (FIG. 4) shall be described with respect to the reactor 220 of FIG. 2.

Turning to FIG. 4, the chuck, which is incorporated in the bottom electrode 228, is shown in greater detail. As can be seen in FIG. 4, the chuck configuration 446, which is preferably an electrostatic chuck, includes a wafer centering ring 448, which holds a wafer 426 against the lower electrode 428. The gas which controls heat transfer from the wafer is delivered in the gas delivery space 454 located between the wafer 426 and the lower electrode 428. Thus the gas delivery space 454 acts as a heat transfer controller in order to control the transfer of heat between the chuck and the wafer. In a preferred embodiment, the wafer centering ring 448 is made of a high purity alumina ceramic and the configuration is set up such that when the gas contained in gas delivery space 454 is helium, that the gas leak rate into the reactor chamber 424 is on the order of less than 2 SCCM, in comparison to a typical process flow rate being for example, 80 SCCM. The temperature can be measured in a preferred embodiment as shown (FIG. 4) by using a fluoroptic probe 460 which uses infrared to sense temperature.

As will be explained below, alternative to or in addition to the modification of heat transfer from the wafer due to the control of the gas pressure (wafer centering ring pressure) in the gas delivery space 454, the chuck 446 can itself be heated in order to heat the wafer. Such heating can be the result of, for example, a resistive heater or cartridge heater 456 contained in the lower electrode 428. Still alternatively, an RF power supply connected to chuck 446 can also be used to heat said chuck. This method can be used with or without the helium chamber 454. With the helium chamber, the pressure in the chamber would be high on the order of 5 to 10 torr in order to conduct the heat from the chuck to the back side of the wafer.

It is to be understood that, of the two embodiments, the first embodiment using the helium filled chamber as opposed to the resistive heater is capable of more rapidly affecting the temperature of the wafer and thus is preferable for use in a chamber which accomplishes both etching of the cobalt silicide at an elevated temperature and the oxide and polysilicon layers at a lower temperature. Other wafer heating apparatus can be used.

Thus, in accordance with the invention, the wafer can be heated (i) by reducing the amount of heat transferred from the wafer by decreasing the pressure of the backside gas or (ii) by increasing the pressure of the gas in order to heat the wafer using a heat source. These two configurations can be practiced separately and be within the scope of the invention. Of course raising the helium backside pressure without a heat source will cause a lowering of the wafer temperature by transferring heat from the wafer to the chuck, and the electrode pedestal if the chuck and/or pedestal are cooler than the wafer.

The gas delivered to the gas delivery space 454 is helium, as helium has a good heat capacity, is light and mobile, and is efficient in transferring energy, Helium pressure from about zero torr to about 20 torr can be effectively used to control the temperature of the wafer. Other gases such as nitrogen and argon could be used, and in addition any gas that has these characteristics and which will not condense could be used. It will be understood that at least some of these gas will leak into the main reaction chamber 424.

Figure 8:
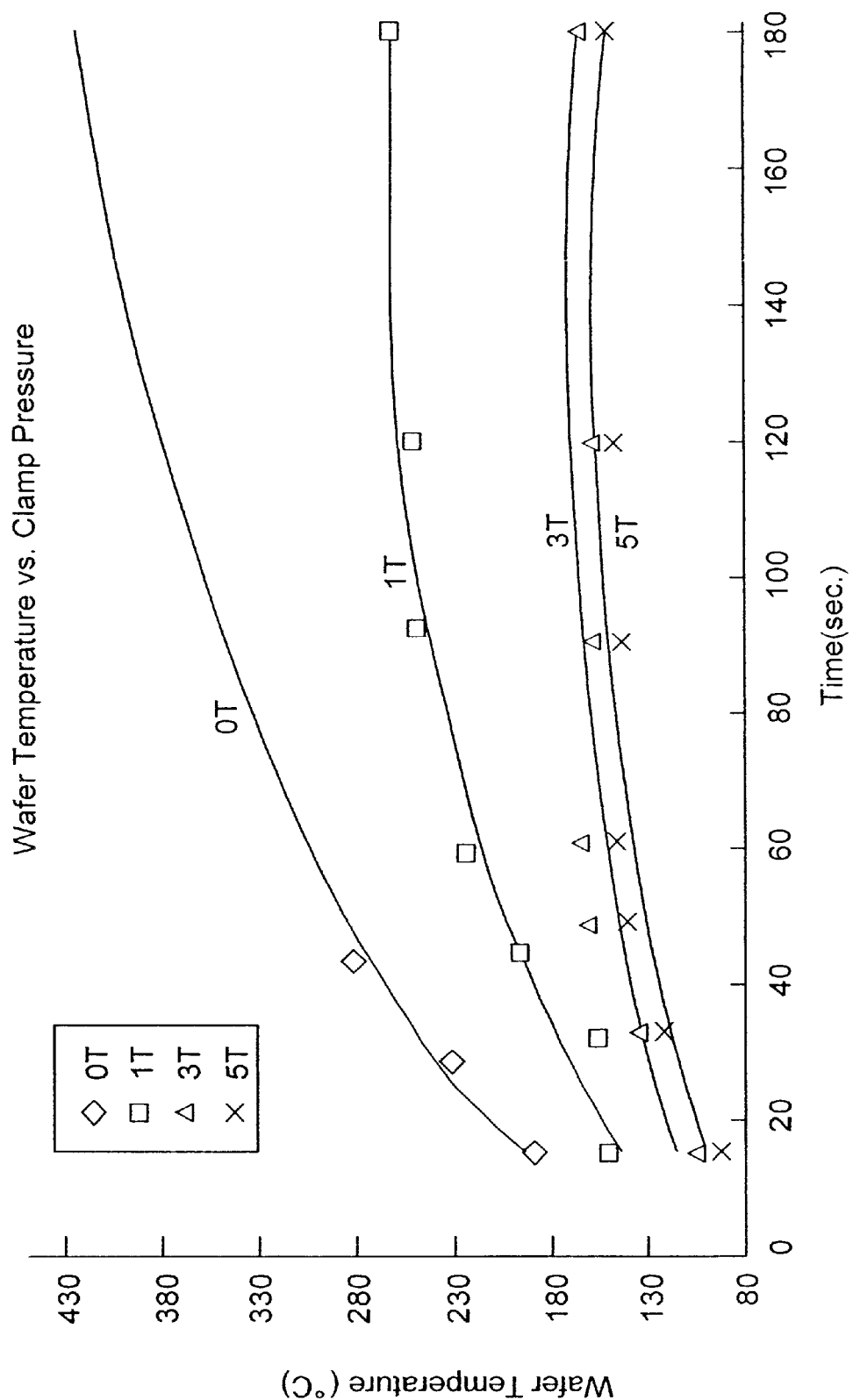
FIG. 8 depicts a graph of wafer temperature with respect to helium pressure in a wafer backside delivery space for a chuck.

In FIG. 8, four curves are plotted. The curves are for helium pressures of approximately 0 torr, 1 torr, 3 torr, and 5 torr, in the gas delivery space 454. At 5 to 10 torr, the temperature of the wafer would be about in the range of 80° C. or lower. As can be seen generally in FIG. 8, at about 3 torr and greater, the wafer surface temperature goes from about 80° C. to about 140° C. within the first 60 seconds. At a helium pressure of about 1 torr in the gas delivery space 454, the water surface temperature goes from about a starting temperature of about 80° C. to over 200° C. in the first 60 seconds and finally levels off at around 240° C. Also as shown in FIG. 8 at close to 0 torr, the temperature of the wafer hits approximately 300° C. in the first 60 seconds and it continues to climb due to the lack of heat transfer from the wafer at such a low pressure for the gas in the gas delivery space 454.

An alternative embodiment of the chuck can be seen in FIG. 5. In this embodiment a second gas delivery space 462 is located below the electrostatic chuck. This space can also be filled with helium at pressures of below 1 torr and up to and above 20 torr in order to effect the temperature of the wafer as described with respect to the first space 454. It is to be understood that the first gas delivery space 454 would offer the first order of control and that the second order of control would be by the second gas delivery space 462. With heater 456 removed or not in use, or with the chuck not heated by an alternative source, the gas pressure in space 462 would be increased to cool the wafer or decreased to allow the reactor chamber to heat the wafer. If the chuck were heated below the second gas delivery space 462, the opposite would be true. That is higher pressure in space 462 would conduct heat to the wafer and lower pressure would lessen the conduction from the heat source. Accordingly, with space 454 at a higher pressure and space 462 at a lower pressure, the heater 456 could heat the wafer, and space 462 could isolate the heater and wafer from a cooler pedestal located below space 462. If it were desired to rapidly cool off the wafer, then the heater would be turned off and both spaces 454 and 462 would be placed at an elevated pressure to increase heat transfer from the wafer. It is to be understood that chuck types other than electrostatic chucks can benefit from the invention.

It is to be understood that the present invention can be carried out in other types of reactors, including by way of example only, electron cyclotron resonance reactors (ECR) and wave excited discharge reactors such as surface wave reactors and helicon reactors.

Industrial Applicability

The present invention is considered to be highly relevant to methods and apparatus for the etching of silicide layers, and in particular metal silicide layers, and further in particular to cobalt silicide layers. Such etch processes are accomplished in a rapid manner while maintaining selectively to the oxide layers. Such processes and apparatus are highly advantageous for use in the DRAM market and also in high speed logic integrated circuit manufacturing.

Other features, aspects and objects of the invention can be obtained from a review of the figures and the claims.

It is to bus understood that other embodiments of the invention can be developed and fall within the spirit and scope of the invention and claims.

We claim:

1. An apparatus for processing a wafer comprising:

a reactor chamber capable of generating a plasma;

a chuck adapted for holding a wafer;

a first gas delivery space adapted to accept a gas at a first pressure in order to control the transfer of heat between the wafer and the chuck; and a second gas delivery space adapted to accept a gas at a second pressure lower than the first pressure in order to thermally isolate the wafer and the chuck.

2. The apparatus of claim 1 wherein:

said first and second gas delivery spaces are adapted to effect the temperature of the wafer without adding any additional heat to the chuck.

3. The apparatus of claim 1 wherein:

said first gas delivery space is a wafer back side space.

4. The apparatus of claim 1 wherein:

said chuck includes a heater between the first gas delivery space and the second gas delivery space that can heat the wafer.

5. The apparatus of claim 1 wherein:

said first gas delivery space is adapted to accept helium.

6. The apparatus of claim 1 wherein:

said second gas delivery space is adapted to accept a gas that has a pressure of less than 1 torr.

7. The apparatus of claim 1 wherein:

said first gas delivery space is adapted to accept a gas that has a pressure between 0 torr and 20 torr.

8. The apparatus of claim 1 wherein:

said first gas delivery space is adapted to accept a gas that has a pressure that causes a wafer to be heated.

9. The apparatus of claim 1 wherein:

said first gas delivery space is adapted to accept a gas that has a pressure that causes a wafer to be cooled.

10. The apparatus of claim 1 further comprising:

a pedestal supporting the apparatus, wherein the second gas delivery space thermally isolates the wafer and the chuck from the pedestal.

11. An apparatus for processing a wafer, comprising:

a reactor chamber capable of generating a plasma;

a chuck adapted for holding a wafer;

a pedestal for supporting the chuck;

a first gas delivery space adapted to accept a gas in order to control the transfer of heat between the wafer and said chuck;

a heater adapted to heat the wafer, the heater being separated from the wafer by said first gas delivery space; and a second gas delivery space positioned between said heater and said pedestal, said second gas delivery space being adapted to thermally isolate said pedestal from the wafer and said chuck.

12. The apparatus of claim 11 wherein:

said first gas delivery space is a wafer back side space.

13. The apparatus of claim 11 wherein:

said first gas delivery space is adapted to accept helium.

14. The apparatus of claim 11 wherein:

said second gas delivery space is adapted to accept a gas that has a pressure of less than 1 torr.

15. The apparatus of claim 11 wherein:

said first gas delivery space is adapted to accept a gas that has a pressure between 0 torr and 20 torr.

16. The apparatus of claim 1 wherein:

said first gas delivery space is adapted to accept a gas that has a pressure that causes a wafer to be heated.

17. An apparatus for processing a wafer, comprising:

a reactor chamber capable of generating a plasma;

a chuck adapted for holding a wafer;

a first gas delivery, space being adapted to accept helium gas having a pressure from about zero torr to about 20 torr in order to control the transfer of heat between the wafer and said chuck;

a heater adapted to heat the wafer, the heater being separated from the wafer by said first gas delivery space; and a second gas delivery space positioned with the heater being between said first gas delivery space and slid second gas; delivery space, said second gas delivery space being adapted to thermally isolate the wafer, said heater, and said chuck.

* * * * *

UNITED STATES PATENT AND TRADEMARK OFFICE
CERTIFICATE OF CORRECTION

PATENT NO.    : 6,391,148 B2
DATED         : May 21, 2002
INVENTOR(S)   : Steven Marks et al.

It is certified that error appears in the above-identified patent and that said Letters Patent is hereby corrected as shown below:

<u>Column 16,</u>
Line 13, after "delivery" and before "space" delete ",".
Line 26, after "and" delete "slid" and substitute therefor -- said --.
Line 27, after "gas" and before "delivery" delete ";".

Signed and Sealed this

Sixteenth Day of July, 2002

*Attest:*

*Attesting Officer*

JAMES E. ROGAN
*Director of the United States Patent and Trademark Office*